(12) United States Patent
Kita et al.

(10) Patent No.: US 10,806,034 B2
(45) Date of Patent: Oct. 13, 2020

(54) CIRCUIT ASSEMBLY

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi (JP)

(72) Inventors: Yukinori Kita, Mie (JP); Kyungwoo Kim, Mie (JP)

(73) Assignees: AutoNetworks Technologies Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 16/469,316

(22) PCT Filed: Dec. 5, 2017

(86) PCT No.: PCT/JP2017/043563
§ 371 (c)(1),
(2) Date: Jun. 13, 2019

(87) PCT Pub. No.: WO2018/110359
PCT Pub. Date: Jun. 21, 2018

(65) Prior Publication Data
US 2020/0113055 A1  Apr. 9, 2020

(30) Foreign Application Priority Data
Dec. 14, 2016 (JP) ................. 2016-241801

(51) Int. Cl.
*H05K 1/18* (2006.01)
*H01L 25/11* (2006.01)
(Continued)

(52) U.S. Cl.
CPC ............ *H05K 1/181* (2013.01); *H01L 25/115* (2013.01); *H05K 1/111* (2013.01);
(Continued)

(58) Field of Classification Search
USPC ......................................................... 361/773
See application file for complete search history.

(56) References Cited

U.S. PATENT DOCUMENTS

2003/0137813 A1  7/2003 Onizuka et al.
2011/0051371 A1* 3/2011 Azuma ................. B60K 6/445
                                                        361/699
(Continued)

FOREIGN PATENT DOCUMENTS

JP  2010-022117 A  1/2010
JP  2017-139303 A  8/2017

OTHER PUBLICATIONS

International Seach Report, Application No. PCT/JP2017/043563, dated Feb. 27, 2018. ISA/Japan Patent Office.

*Primary Examiner* — Andargie M Aychillhum
(74) *Attorney, Agent, or Firm* — Honigman LLP

(57) ABSTRACT

A circuit assembly 1 includes a semiconductor switching element, a main substrate, a plurality of bus bars and a sub-substrate that are overlaid on the main substrate, and a jumper wire. The main substrate includes a first insulating substrate and a first conductive path. The sub-substrate includes a second insulating substrate and a second conductive path, and is overlaid on the main substrate and arranged in the same layer as the bus bars. The jumper wire connects the first conductive path with the second conductive path. A plurality of terminals of the semiconductor switching element include a drain terminal 42 and a source terminal that are connected to the bus bar and a gate terminal connected
(Continued)

to the second conductive path. A noise reduction element is mounted on the sub-substrate.

2 Claims, 4 Drawing Sheets

(51) Int. Cl.
*H05K 1/11* (2006.01)
*H01R 9/00* (2006.01)

(52) U.S. Cl.
CPC .............. *H05K 2201/10015* (2013.01); *H05K 2201/10166* (2013.01); *H05K 2201/10272* (2013.01); *H05K 2201/10363* (2013.01)

(56) References Cited

U.S. PATENT DOCUMENTS

| | | |
|---|---|---|
| 2015/0223339 A1* | 8/2015 | Nakamura .......... H01L 23/3107 361/705 |
| 2017/0367189 A1 | 12/2017 | Nakamura et al. |
| 2018/0020542 A1 | 1/2018 | Nakamura et al. |
| 2018/0049316 A1 | 2/2018 | Muronoi et al. |
| 2018/0278034 A1 | 9/2018 | Chin et al. |

* cited by examiner

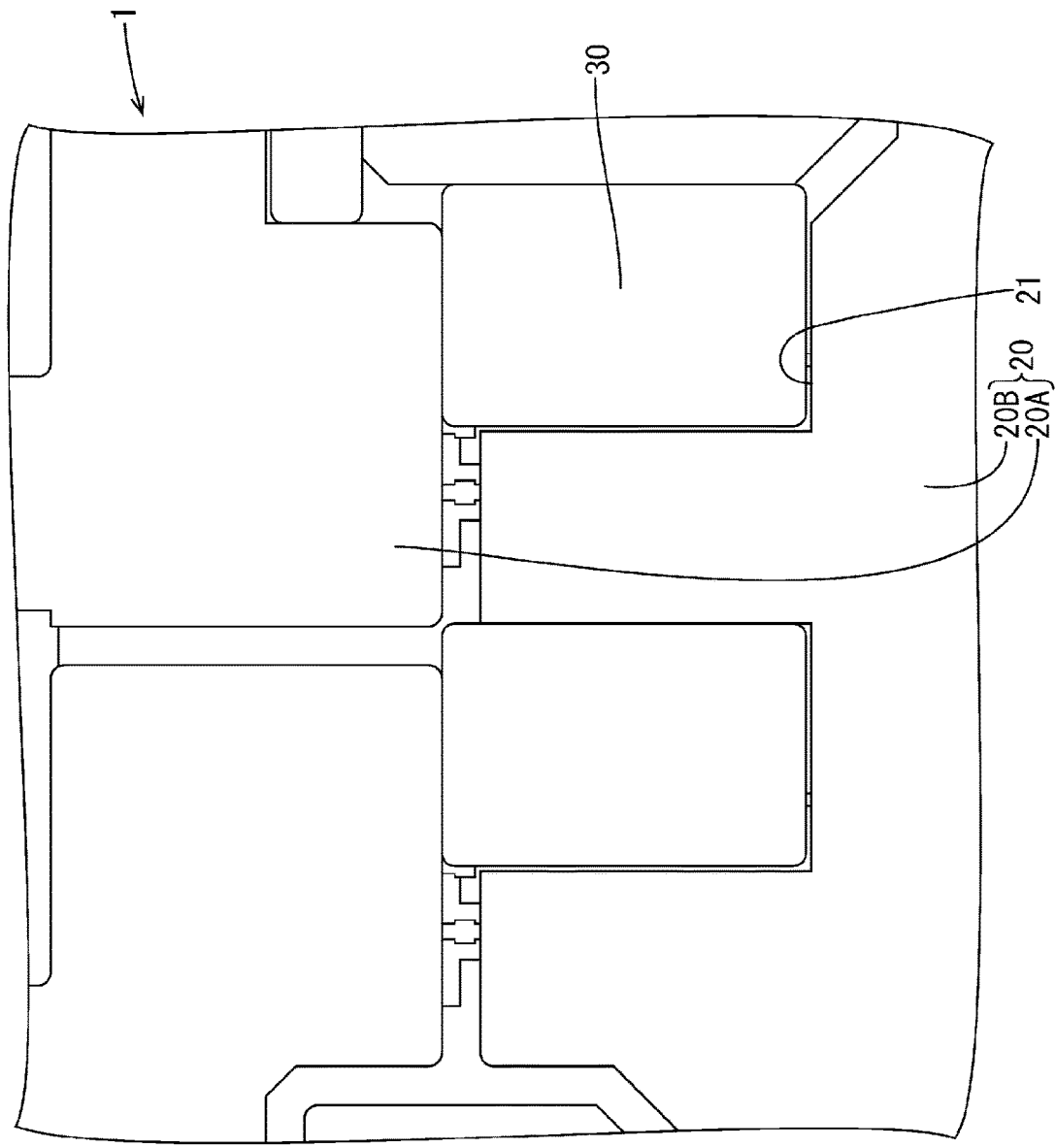

CIRCUIT ASSEMBLY

CROSS-REFERENCE TO RELATED APPLICATIONS

This application is the U.S. national stage of PCT/JP2017/043563 filed on Dec. 5, 2017, which claims priority of Japanese Patent Application No. JP 2016-241801 filed on Dec. 14, 2016, the contents of which are incorporated herein.

TECHNICAL FIELD

The present specification discloses a technique relating to a circuit assembly.

BACKGROUND

Circuit assemblies having semiconductor switching elements mounted thereon are known that include a plurality of bus bars that are part of an electrical power circuit and a control circuit board overlaid on the bus bars. In this kind of circuit assembly, the control circuit board includes opening portions, and the bus bars are exposed inside the opening portions. Some of the plurality of terminals included in the semiconductor switching elements are connected to conductor patterns on a surface of the control circuit board, and the other terminals are connected to the bus bars exposed from the opening portions (see JP 2003-164039).

In the circuit assembly as described above, level differences are formed between the conductor pattern on the surface of the circuit board and the bus bars exposed from the opening portions of the circuit board, in accordance with the thickness of the circuit board. As such, there is a problem in that leads of the semiconductor switching element need to be bent in accordance with such level differences, which complicates the manufacturing process. Also, there is a demand for arranging another element related to the semiconductor switching element in the vicinity of the semiconductor switching element. Conventional circuit assemblies are insufficient in solving the problem and meeting this demand simultaneously, and thus they have room for improvement.

SUMMARY

A circuit assembly disclosed in the present specification includes: a semiconductor switching element including a plurality of terminals; a first substrate that has a first insulating layer and a first conductive path that is arranged at least on one side of the first insulating layer; a bus bar overlaid on the first substrate; a second substrate that has a second insulating layer and a second conductive path that is arranged on at least one side of the second insulating layer, that is overlaid on the first insulating layer, and that is arranged in the same layer as the bus bar, and a connection member that is conductive and connects the first conductive path with the second conductive path, and the plurality of terminals include a bus bar connection terminal connected to the bus bar and a conductive path connection terminal connected to the second conductive path, and another element is mounted on the second substrate, the other element being a control element for controlling the semiconductor switching element or a noise reduction element for reducing noise caused by the semiconductor switching element.

According to the above-described configuration, the second substrate is arranged in the same layer as the bus bars, and the conductive path connection terminal of the plurality of terminals of the semiconductor switching element is connected to the second conductive path of the second substrate. According to this configuration, the level difference between a surface to which the conductive path connection terminal is connected and a surface to which the bus bar connection terminal is connected can be reduced, and therefore a burden of bending the terminals in accordance with the level difference can be reduced, which can prevent the manufacturing process from being complicated.

Also, the control element or the noise reduction element is mounted on the second substrate. The elements are preferably arranged in the vicinity of the semiconductor switching element, and can be arranged adjacent to the semiconductor switching element by mounting the elements on the second substrate to which the terminal of the semiconductor switching element is connected.

In the above configuration, a first opposing face of the second substrate that faces the first substrate may also be level (flush) with a second opposing face of the bus bar that faces the first substrate.

According to this configuration, the level difference between the face to which the conductive path connection terminal is connected and the face to which the bus bar connection terminal is connected can be eliminated, and therefore a process for bending the terminals in accordance with the level difference is no longer necessary, and the manufacturing process can be prevented from being complicated.

Advantageous Effects of Disclosure

According to the circuit assembly disclosed in the present specification, the semiconductor switching element can be easily mounted.

BRIEF DESCRIPTION OF DRAWINGS

FIG. 4 is a bottom view of the circuit assembly of the embodiment.

DETAILED DESCRIPTION OF PREFERRED EMBODIMENTS

Hereinafter, an embodiment will be described with reference to FIGS. 1 to 4. A circuit assembly 1 of the present embodiment is arranged between a battery and various types of on-board electric components in a vehicle such as an electric automobile and a hybrid automobile, distributes and supplies electric power supplied from the battery to the electric components, and controls an operation such as switching of the electric power supply.

Figure 2:
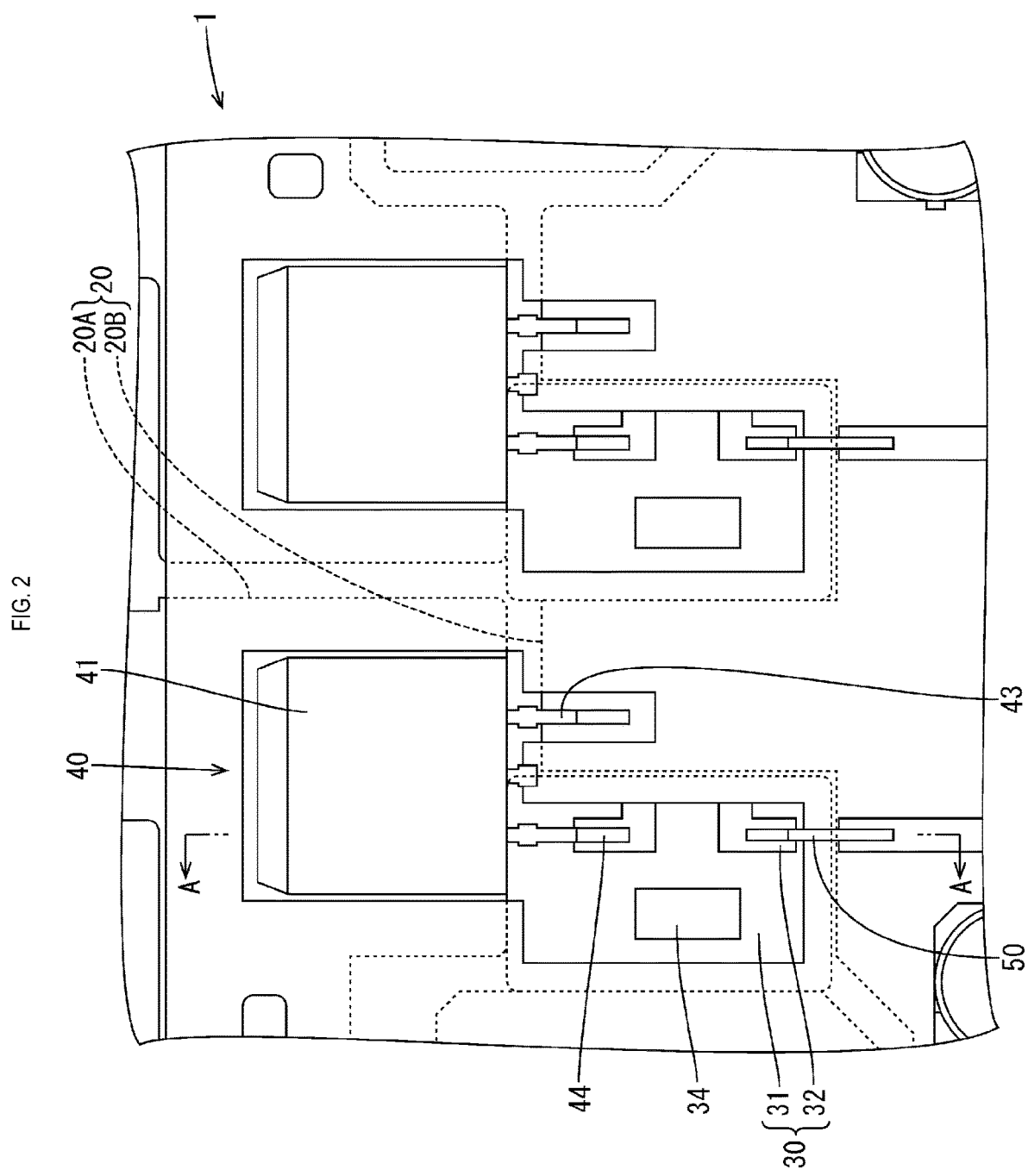
FIG. 2 is a partial enlarged plan view of the circuit assembly of the embodiment.
Figure 3:
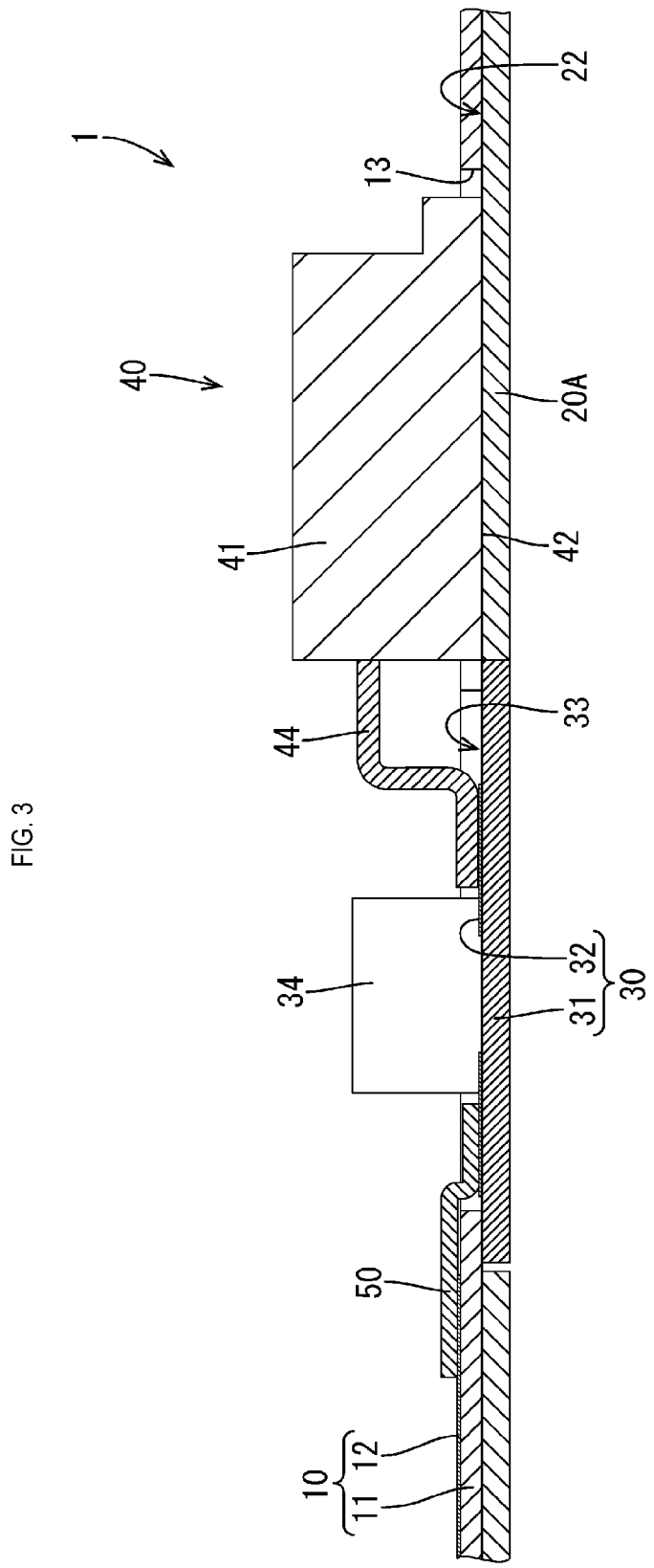
FIG. 3 is a cross-sectional view taken along A-A line in FIG. 2.

As shown in FIGS. 2 and 3, the circuit assembly 1 includes a main substrate 10 (corresponding to a first substrate), a plurality of bus bars 20 and a plurality of sub-substrates 30 (corresponding to second substrates) that are adhered to this main substrate 10 via adhering sheets (not shown), and a plurality of semiconductor switching elements 40 are mounted on the circuit assembly 1.

The main substrate 10 is a printed wiring board having a typical configuration including a first conductive path 12 formed using a printed wiring technology on one side (the upper side in FIG. 3) of a first insulating substrate 11 (corresponding to a first insulating layer) constituted by a glass base material or a nonwoven glass fabric base material.

Each of the plurality of bus bars 20 is a band-shaped member formed of metal having excellent electrical conductivity. The plurality of bus bars 20 are overlaid on the other side (the lower side in FIG. 3) of the main substrate 10 via adhering sheets or an adhesive agent (not shown), and are adhered to the main substrate 10 with the adhering sheets or the adhesive agent.

The sub-substrates 30 are small rectangular printed wiring boards that have a typical configuration including a second conductive path 32 formed using a printed wiring technology on one side (the upper side in FIG. 3) of a second insulating substrate 31 (corresponding to a second insulating layer) constituted by a glass base material or a nonwoven glass fabric base material. The plurality of sub-substrates 30 are overlaid on the other side (the lower side in FIG. 3) of the main substrate 10 via adhering sheets (not shown), and are adhered to the main substrate 10 with the adhering sheets. The sub-substrates 30 are arranged in the same layer as the bus bars 20 along the same plane as that of the main substrate 10 to which the bus bars 20 are adhered.

Figure 1:
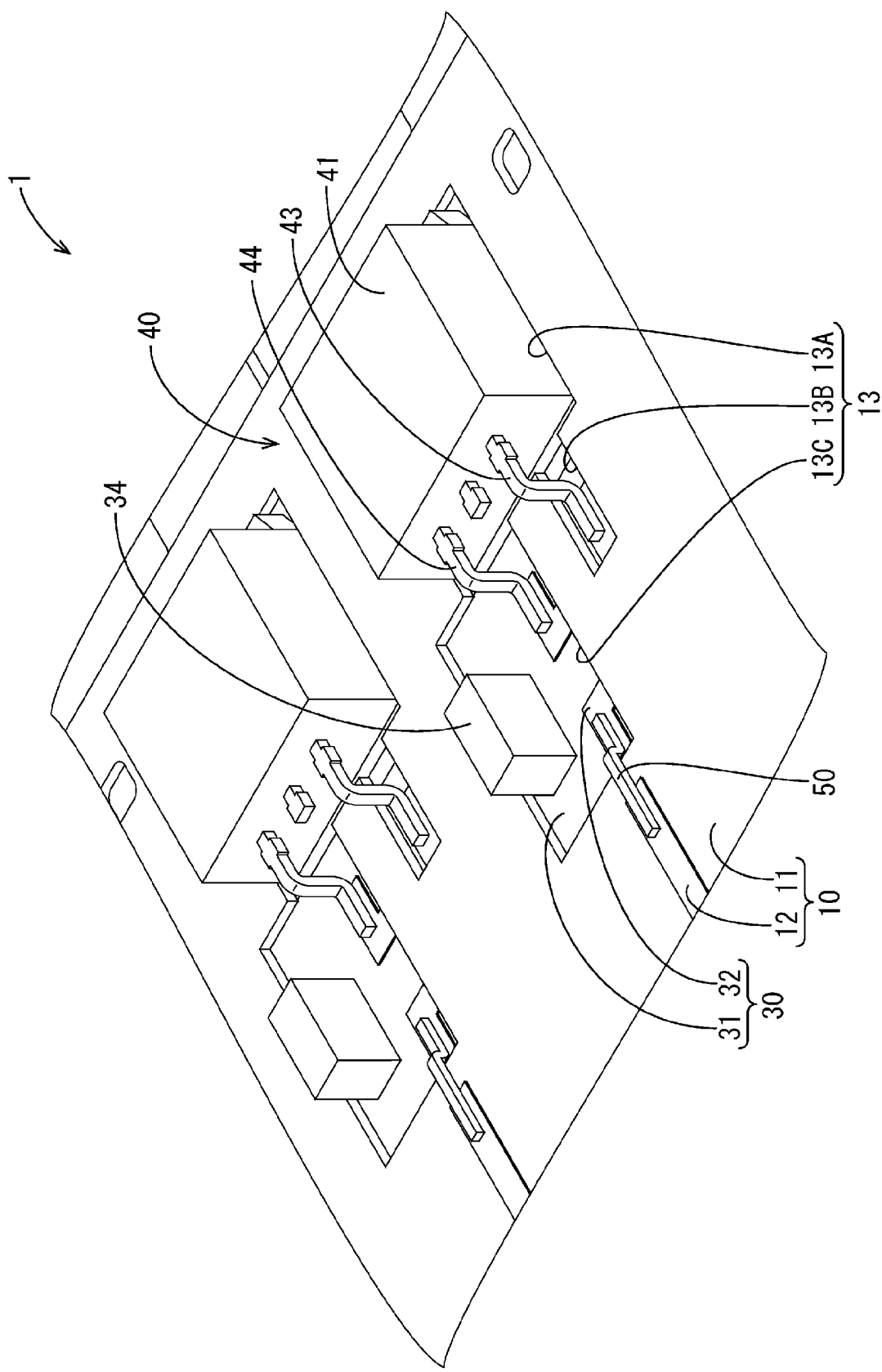
FIG. 1 is a partial enlarged perspective view of a circuit assembly of an embodiment.

As shown in FIGS. 1 and 3, the semiconductor switching elements 40 are FETs (Field Effect Transistors), and include a housing 41, a drain terminal 42 (corresponding to a bus bar connection terminal) that is linked to the housing 41, a source terminal 43 (corresponding to a bus bar connection terminal), and a gate terminal 44 (corresponding to a conductive path connection terminal). The drain terminal 42 is arranged on the lower surface of the housing 41. The source terminal 43 and the gate terminal 44 protrude from the side surface of the housing 41.

The main substrate 10 includes a plurality of mounting windows 13. Each mounting window 13 is an opening portion extending from one side (a side on which the bus bars 20 are arranged) of the main substrate 10 to the opposite side, and as shown in FIGS. 1 and 2, has a shape in which three window portions 13A, 13B, and 13C are linked to each other. One of the three window portions 13A, 13B, and 13C is a rectangular first window portion 13A that is a little larger than the housing 41 of the semiconductor switching element 40 and that accomodates the housing 41. Another one is a rectangular second window portion 13B that accomodates a source terminal 43 of the semiconductor switching element 40 and that is linked with the first window portion 13A. The remaining one is a third window portion 13C that is linked with the first window portion 13A, arranged next to the second window portion 13B, and a little smaller than the sub-substrate 30.

The mounting windows 13 are arranged at positions that span two neighboring bus bars 20 (i.e. between two neighboring bus bars). Portions of the two bus bars 20 and the sub-substrate 30 are exposed inside the mounting windows 13. Hereinafter, to distinguish the two bus bars 20 arranged with the mounting window 13 in between them, one of them is called "the one bus bar 20A" and the other is called "the other bus bar 20B", and when the plurality of bus bars are collectively called without distinguishing them, they are called "the bus bars 20".

The other bus bar 20B includes a cutout portion 21 having a shape that is cut inward from the side edge that is adjacent to the one bus bar 20A, and the sub-substrate 30 fitted inside the cutout portion 21. The edge portion of the sub-substrate 30 is adhered to the main substrate 10, and the majority of the sub-substrate 30 excluding the edge portion is exposed from the third window portion 13C. A first opposing face 33 of the sub-substrate 30 that faces the main substrate 10 is level with second opposing faces 22 of the plurality of bus bars 20 that face the main substrate 10.

The plurality of semiconductor switching elements 40 are respectively arranged inside the plurality of mounting windows 13. The drain terminal 42 is connected to a part of the one bus bar 20A exposed inside the mounting window 13, and the source terminal 43 is connected to a part of the other bus bar 20B. The gate terminal 44 is connected to the second conductive path 32 on the sub-substrate 30. Here, a first opposing face 33, of the sub-substrate 30, that faces the main substrate 10 is level with second opposing faces 22, of the plurality of bus bars 20, that face the main substrate 10. That is to say, since there is no level difference between the surface of the sub-substrate 30 to which the gate terminal 44 is connected and the surfaces of the bus bars 20 to which the drain terminal 42 and the source terminal 43 are connected, it is not necessary to bend the lead of the semiconductor switching element in accordance with the level difference unlike in the conventional technology. In this manner, it is possible to prevent the manufacturing process from being complicated.

The first conductive path 12 of the main substrate 10 and the second conductive path 32 of the sub-substrate 30 are connected to each other with a jumper wire 50 (corresponding to a connection member). The jumper wire 50 is a wire material constituted by a conductive material such as metal, and its one end portion is connected to the first conductive path 12, whereas its other end portion is connected to the second conductive path 32.

Other elements related to the semiconductor switching element 40 are mounted on the sub-substrate 30. The other elements are preferably arranged in the vicinity of the semiconductor switching element 40, and examples of the other element include a noise reduction element 34 (corresponding to the other element: e.g. a ceramic condenser) for reducing noise caused by the semiconductor switching element 40. Mounting the noise reduction element 34 on the sub-substrate 30 makes it possible to shorten the wiring distance between the semiconductor switching element 40 and the noise reduction element 34, thereby maximizing the noise reduction effect of the noise reduction element 34.

Note, that in FIGS. 1, 2, and 3, only the parts of the first conductive path 12 and the second conductive path 32 that are connected to the source terminal 43, the gate terminal 44, and the jumper wire 50 are illustrated and the other parts are omitted in order to make it easy to understand the drawings.

As described above, according to the present embodiment, the circuit assembly 1 includes the semiconductor switching element 40 that has the plurality of terminals 42, 43 and 44, the main substrate 10, the plurality of bus bars 20 and the sub-substrates 30 that are overlaid on the main substrate 10, and the jumper wire 50. The main substrate 10 includes the first insulating substrate 11 and the first conductive path 12 arranged on one side of the first insulating substrate 11. The sub-substrates 30 include the second insulating substrate 31 and the second conductive path 32 arranged on one side of the second insulating substrate 31, and are overlaid on the main substrate 10 and arranged in the same layer (on the same level) as the bus bars 20. The first opposing face 33 of the sub-substrate 30 that faces the main substrate 10 is level with a second opposing faces 22 of the bus bars 20 that face the main substrate 10. The jumper wire 50 is conductive and connects the first conductive path 12 with the second conductive path 32. The plurality of terminals 42, 43 and 44 of the semiconductor switching element 40 include the drain terminal 42 and the source terminal 43 that are connected to the bus bars 20 and the gate terminal 44 that is connected to the second conductive path 32. Furthermore, the noise reduction element 34 for reducing noise caused by the semiconductor switching element 40 is mounted on the sub-substrate 30.

In this manner, the sub-substrate 30 is arranged in the same layer (on the same level) as the bus bars 20, and the gate terminal 44 out of the plurality of terminals 42, 43 and 44 of the semiconductor switching element 40 is connected to the second conductive path 32 of the sub-substrate 30. Also, the first opposing face 33 of the sub-substrate 30 that faces the main substrate 10 is level with a second opposing faces 22 of the bus bars 20 that face the main substrate 10. According to this configuration, the level difference between the face to which the gate terminal 44 is connected and the face to which the drain terminal 42 and the source terminal 43 are connected can be eliminated, and therefore it is no longer necessary to bend the terminals in accordance with the level difference, which can prevent the manufacturing process from being complicated.

In addition, the noise reduction element 34 for reducing noise caused by the semiconductor switching element 40 is mounted on the sub-substrate 30. In this manner, mounting the noise reduction element 34 on the sub-substrate 30 to which the gate terminal 44 of the semiconductor switching element 40 is connected makes it possible to arrange the noise reduction element 34 adjacent to the semiconductor switching element 40, thereby maximizing the noise reduction effect.

Other Embodiments

The technique disclosed in the present specification is not intended to be limited to the embodiment illustrated with the above description with reference to the drawings, and, for example, various types of embodiments as described below may also be included.

Although the noise reduction element 34 is mounted on the sub-substrate 30 in the above-described embodiment, the other element mounted on the second substrate may also be a control element for controlling the semiconductor switching element (e.g. capacitor and condenser). Furthermore, both the noise reduction element and the control element may also be mounted on the second substrate.

Although the first opposing face 33 of the sub-substrate 30 that faces the main substrate 10 is level with the second opposing faces 22 of the bus bars 20 that face the main substrate 10 in the above-described embodiment, a little level difference may also be present between the first opposing face and the second opposing face as long as the burden of bending the terminals is not large.

The invention claimed is:

1. A circuit assembly including:
   a semiconductor switching element including a plurality of terminals;
   a first substrate that has a first insulating layer and a first conductive path that is arranged at least on one side of the first insulating layer;
   a bus bar overlaid on the first substrate;
   a second substrate that has a second insulating layer and a second conductive path that is arranged on at least one side of the second insulating layer, that is overlaid on the first insulating layer, and that is arranged in the same layer as the bus bar, and
   a connection member that is conductive and connects the first conductive path with the second conductive path,
   wherein the plurality of terminals include a bus bar connection terminal connected to the bus bar and a conductive path connection terminal connected to the second conductive path, and
   another element is mounted on the second substrate, the other element being a control element for controlling the semiconductor switching element or a noise reduction element for reducing noise caused by the semiconductor switching element.

2. The circuit assembly according to claim 1, wherein a first opposing face of the second substrate that faces the first substrate is level with a second opposing face of the bus bar that faces the first substrate.

* * * * *